United States Patent
Koroishi et al.

(12) 
(10) Patent No.: US 6,690,100 B1
(45) Date of Patent: Feb. 10, 2004

(54) PIEZOELECTRIC ACTUATOR AND METHOD OF COMPENSATING DIRECTION THEREOF

(75) Inventors: Keitaro Koroishi, Chiba (JP); Hironobu Itoh, Chiba (JP); Tomoyuki Yoshino, Chiba (JP)

(73) Assignee: Seiko Instruments Inc., Chiba (JP)

( * ) Notice: Subject to any disclaimer, the term of this patent is extended or adjusted under 35 U.S.C. 154(b) by 447 days.

(21) Appl. No.: 09/299,470

(22) Filed: Apr. 26, 1999

(30) Foreign Application Priority Data

Apr. 27, 1998 (JP) .......................................... 10-117433
Mar. 4, 1999 (JP) .......................................... 11-057602

(51) Int. Cl.$^7$ .............................................. H01L 41/08
(52) U.S. Cl. .............................. 310/323.03; 310/323.06
(58) Field of Search ........................... 310/323.06, 366, 310/311, 338, 361

*Primary Examiner*—Mark O. Budd
(74) *Attorney, Agent, or Firm*—Adams & Wilks

(57) ABSTRACT

A piezoelectric actuator is formed in a manner which enhances the identifying function of markings provided thereon, and minimizes the influence on the markings when an electrode pattern on the piezoelectric actuator is shifted. The piezoelectric actuator has a piezoelectric element, an electrode pattern formed thereon, and at least one identifying marking formed on the electrode pattern, each identifying marking having a shape comprising multiple sides and being formed at a specific location of the electrode pattern for use in identifying a characteristic of the electrode pattern. In one embodiment, the piezoelectric element has a disk shape, the electrode pattern comprises a plurality of electrodes provided on an inner side of the piezoelectric element, selected electrodes being connected to each other in a desired pattern, and the identifying marking is formed on the electrode pattern proximate a peripheral edge of the piezoelectric-element and has at least three straight sides so that the area of the identifying marking is based on the length of its sides rather than a radius. Thus, shifting of the identifying marking with respect to the curved peripheral edge of the disk-shaped piezoelectric element results in reduction in area of the identifying marking on a linear basis rather than based on a squared value of a radius. In another embodiment, a plurality of identifying markings are arranged in a spaced-apart relation on the piezoelectric element.

17 Claims, 17 Drawing Sheets

PIEZOELECTRIC ACTUATOR AND METHOD OF COMPENSATING DIRECTION THEREOF

BACKGROUND OF THE INVENTION

The present invention relates to a piezoelectric actuator in which a marking is formed at an electrode pattern on a piezoelectric element and a method of compensating a direction thereof.

In recent times, in the field of a micromotor, a piezoelectric actuator utilizing a piezoelectric element subjected to predetermined polarization processing has attracted attention.

In the procedure of fabricating the piezoelectric actuator, there is utilized a marking produced by forming a shape of an electrode pattern in identifying directions of polarization of respective divided electrodes in polarization processing, identifying a direction of a set position of the piezoelectric element in forming an electrode pattern for shortcircuiting, in identifying a direction of pasting a piezoelectric element on an elastic member in pasting operation, in identifying a direction of assembling a motor in assembling operation and in identifying a direction of attaching lead wires in attaching operation.

FIG. 17 shows a plane structure of a piezoelectric actuator according to a conventional example.

A piezoelectric actuator 100 according to the conventional example is installed with a piezoelectric element 101 produced by dividing a circular disk body in a fan-like shape in the peripheral direction, an electrode pattern 102 formed with electrodes 102a, 102b, 102c, 102d, 102e and 102f at every other divided portion in the fan-like shape of the piezoelectric element 101 in which the electrodes are short-circuited at outer peripheral portions thereof, an electrode pattern 103 formed with electrodes 103a, 103b, 103c, 103d, 103e and 103f similarly in a fan-like shape in which the electrodes are shortcircuited at inner peripheral portions thereof and an entire face electrode, not illustrated, formed on a side of the piezoelectric element 101 opposed to the electrode patterns 102 and 103, and further formed with a marking 104 in a semicircular shape at a portion of the outer peripheral portion of the electrode 102a in the fan-like shape of the electrode pattern 102 (for example, refer to JP-A-1-283074, JP-A-3-219681).

However, the above-described marking 104 in the semicircular shape cannot be set with an area larger than that illustrated above to avoid overlapping the entire face electrode formed on the opposed side.

Further, when the divided electrode 102a in the fan-like shape and the piezoelectric element 101 are formed to shift from each other, there also causes a situation in which the position of the marking 104 cannot be detected by an image processing apparatus. The reason is as follows.

1) When a portion of the marking 104 rests on the outer periphery of the piezoelectric element 101, the area of the marking 104 is extremely reduced in accordance with the radius of curvature of the circle.

2) The marking 104 is deviated from the outer periphery of the piezoelectric element 101 and the marking is not formed at all.

3) An area of a blank margin portion in a ring-like shape between the divided electrode 102a in the fan-like shape and the outer periphery of the piezoelectric element 101 (portion not formed with the electrode pattern 102) is widened and the marking 104 cannot be discriminated from the blank margin portion.

Further, when dirt or dust having a shape and a size similar to those of the marking 104 is adhered to the electrode pattern 102 or 103, there poses a problem in which the correct position of the marking cannot be detected.

SUMMARY OF THE INVENTION

It is an object of the invention to provide a piezoelectric actuator and a method of compensating a direction thereof promoting a function of identifying a marking and minimizing adverse influence on a marking even when an electrode pattern is formed to shift.

That is, according to solving means of the problem, there is provided a piezoelectric actuator characterized in that in a piezoelectric actuator having a piezoelectric element forming an electrode pattern:

wherein the electrode pattern is formed with at least one marking in a shape comprising multiple sides (When the shape is closed, a polygonal shape is constituted. The same as follows.) for determining a direction of forming the electrode pattern of the piezoelectric element.

In the above-described solving means, the shape of the marking includes a shape comprising three sides (When the shape is closed, a tetragonal shape is constituted. The same as follows.), a shape comprising four sides (When the shape is closed, a pentagonal shape is constituted. The same as follows.) or other shape comprising multiple sides. Further, the position of the marking includes that of either of cases of forming the marking at an outer peripheral portion of the electrode pattern and at inside thereof.

The piezoelectric element includes shapes of a circular disk, a ring-like shape, a polygon and the like.

According to the solving means, the area surrounded by the shape comprising multiple sides becomes larger than an area surrounded by a semicircle and accordingly, the identifying function of the marking is promoted. Further, when the marking having the shape comprising multiple sides rests on the outer periphery of the piezoelectric element, the area is reduced in accordance with an internal angle of the shape comprising multiple sides and accordingly, a rate of reducing the area is smaller than that of reducing the marking in the semicircular shape.

Further, according to the piezoelectric actuator, the marking is featured in having a shape comprising three sides.

According to the solving means, an area surrounded by the shape comprising three sides becomes larger than the area surrounded by a semicircle and accordingly, the identifying function of the marking is promoted. Further, when the marking having the shape comprising three sides rests on the outer periphery of the piezoelectric element, the area is reduced by a constant rate and accordingly, the rate of reducing the area is smaller than that of reducing the marking in the semicircular shape.

Further, there is provided a piezoelectric actuator characterized in that in a piezoelectric actuator in which a piezoelectric element is divided in a peripheral direction and electrodes are formed at divided portions at least contiguous to each other to thereby constitute an electrode pattern:

wherein at least one marking for determining a direction of forming the electrode pattern of the piezoelectric element is formed on an inner side of an outer periphery of the electrode pattern and between the electrodes contiguous to each other in the electrode pattern.

In the above-described solving means, the shape of the piezoelectric element includes any of a circular disk shape, a ring-like shape, a polygonal shape and so on. Further, the respective electrodes formed at the divided portions include either of a system for connecting leads to the respectives and a system of shortcircuiting predetermined ones of the electrodes.

The shape of the marking includes a circular shape, a semicircular shape, a shape comprising two sides, a shape comprising three sides and other shapes comprising multiple sides as well.

According to the solving means, the marking is disposed on an inner side of an outer periphery of the electrode pattern and accordingly, even when the electrode pattern rests on the outer periphery of the piezoelectric element, no adverse influence is effected and sufficient identifying performance is ensured.

Further, there is provided a piezoelectric actuator characterized in that in a piezoelectric actuator having a piezoelectric element which is divided equally by n in a peripheral direction and in which p of consecutive divided portions polarized in one direction and p of consecutive divided portions polarized in a direction reverse to the one direction are alternately arranged and electrodes are formed at n of the divided portions of the piezoelectric element:

wherein the electrode pattern is formed with m of markings for determining a direction of forming the electrode pattern of the piezoelectric element at equal intervals (where m=n/(2×p), m: an optimum number of markings, n: a number of dividing the piezoelectric element, p: a number of consecution in the same polarization direction).

In the above-described solving means, the piezoelectric element includes any of a circular disk shape, a ring-like shape, a polygonal shape and so on.

The shape of the marking includes a circular shape, a semicircular shape, a shape comprising two sides, a shape comprising three sides and a shape comprising multiple sides as well. The position of the marking includes any of a case where it is formed at an outer peripheral portion of the electrode, a case where it is formed at inside of the electrode and a case where it is formed between electrodes.

According to the solving means, by recognizing any of the markings, a direction of polarization of the respective divided portion of the piezoelectric element can be specified. That is, the markings are formed at each unit (2×p) of an arrangement of a polarization direction polarized regularly and accordingly, when any of m of the markings is recognized, the directions of polarization of n of the divided portions become apparent. Further, the direction of the electrode pattern of the piezoelectric is compensated among the unit divided portions in the direction of polarization and accordingly, a rotational angle to be compensated for can be reduced.

Further, there is provided a method of compensating a direction of the piezoelectric actuator according to any one of the above-described piezoelectric elements, characterized in comprising the steps of:

recognizing the markings formed at the electrode pattern on the piezoelectric element, determining the direction of forming the electrode pattern of the piezoelectric element based on the recognized markings, determining an angle to be compensated by comparing the direction of forming and a set direction of the electrode pattern of the piezoelectric element and compensating the piezoelectric element in the set direction by pivoting the piezoelectric element by the compensated angle.

In the above-described solving means, the method of recognizing the marking includes either of a method by optical observation and a method by mechanical means of a camera or the like.

Further, the direction compensating method is used, for example, in adjusting a direction of the piezoelectric element when polarization is carried out, a direction of a set position of the piezoelectric element in forming the electrode pattern for shortcircuiting, a direction of pasting the piezoelectric element on an elastic body, a direction of assembling a motor in assembling operation and a direction of attaching lead wires in attaching operation.

According to the solving means, the marking formed at the electrode pattern on the piezoelectric element is clearly recognized, the direction of forming the electrode pattern of the piezoelectric element is determined based on the recognized marking, the angle to be compensated for is determined by comparing the direction of forming the electrode pattern of the piezoelectric element with the set direction and the piezoelectric element is compensated to the set direction by pivoting it by an amount of the angle of compensation.

BRIEF DESCRIPTION OF THE DRAWINGS

FIG. 15 is an explanatory view showing a plane structure of a piezoelectric actuator in a fifth modified mode according to. FIG. 7.

DETAILED DESCRIPTION OF THE PREFERRED EMBODIMENTS

A detailed explanation will be given of embodiments according to the invention in reference to FIG. 1 through FIG. 16 as follows.

Embodiment 1

Figure 1:
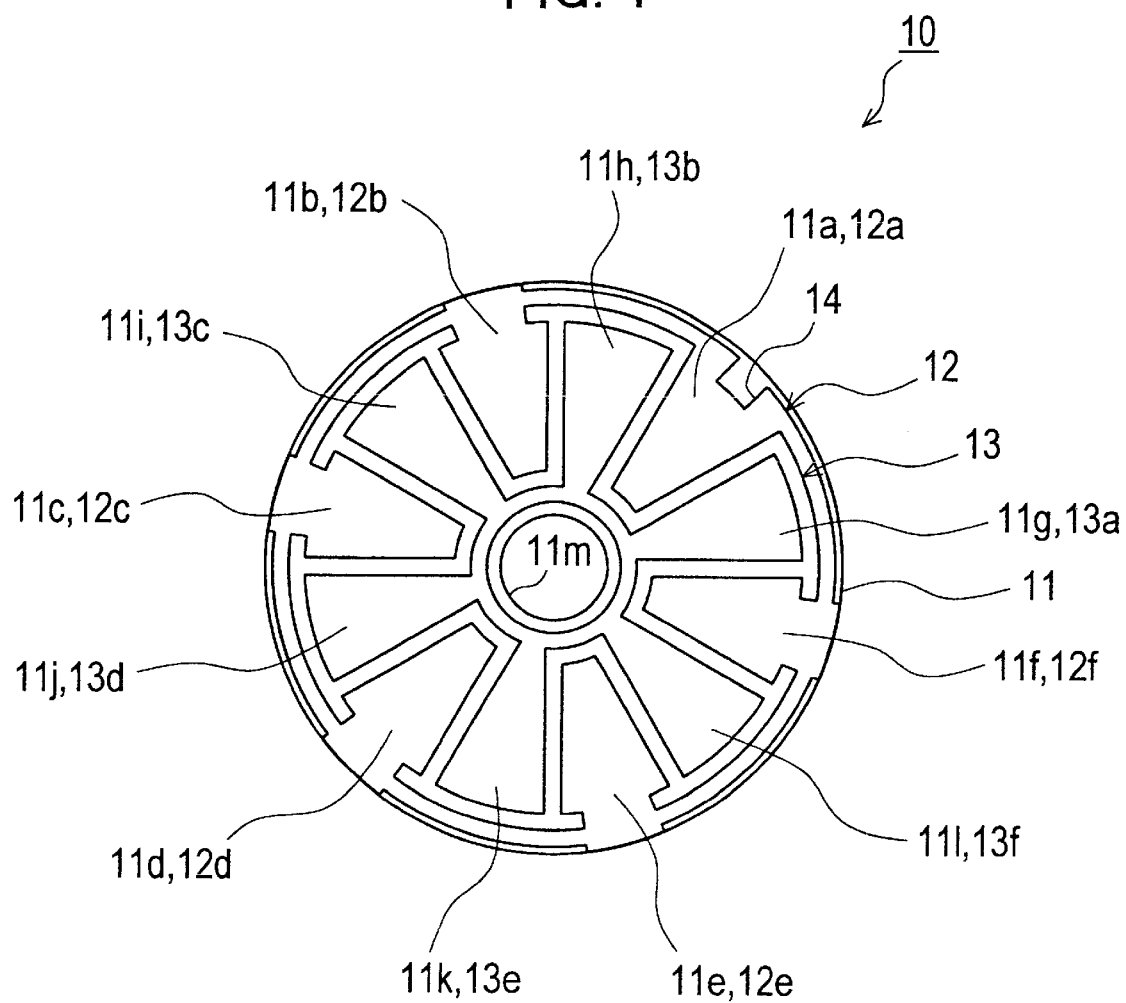
FIG. 1 is an explanatory view showing a plane structure of a piezoelectric actuator according to Embodiment 1 to which the invention is applied.

FIG. 1 shows a plane structure of a piezoelectric actuator.

A piezoelectric actuator 10 is provided with a piezoelectric element 11 and electrode patterns 12 and 13.

In this case, the piezoelectric element 11 is formed in a circular disk shape by using, for example, barium titanate, lead titanate, lithium niobate, lithium tantalate or lead titanate/lead zirconate solid solution and a center hole 11m is formed at its center.

Figure 4:
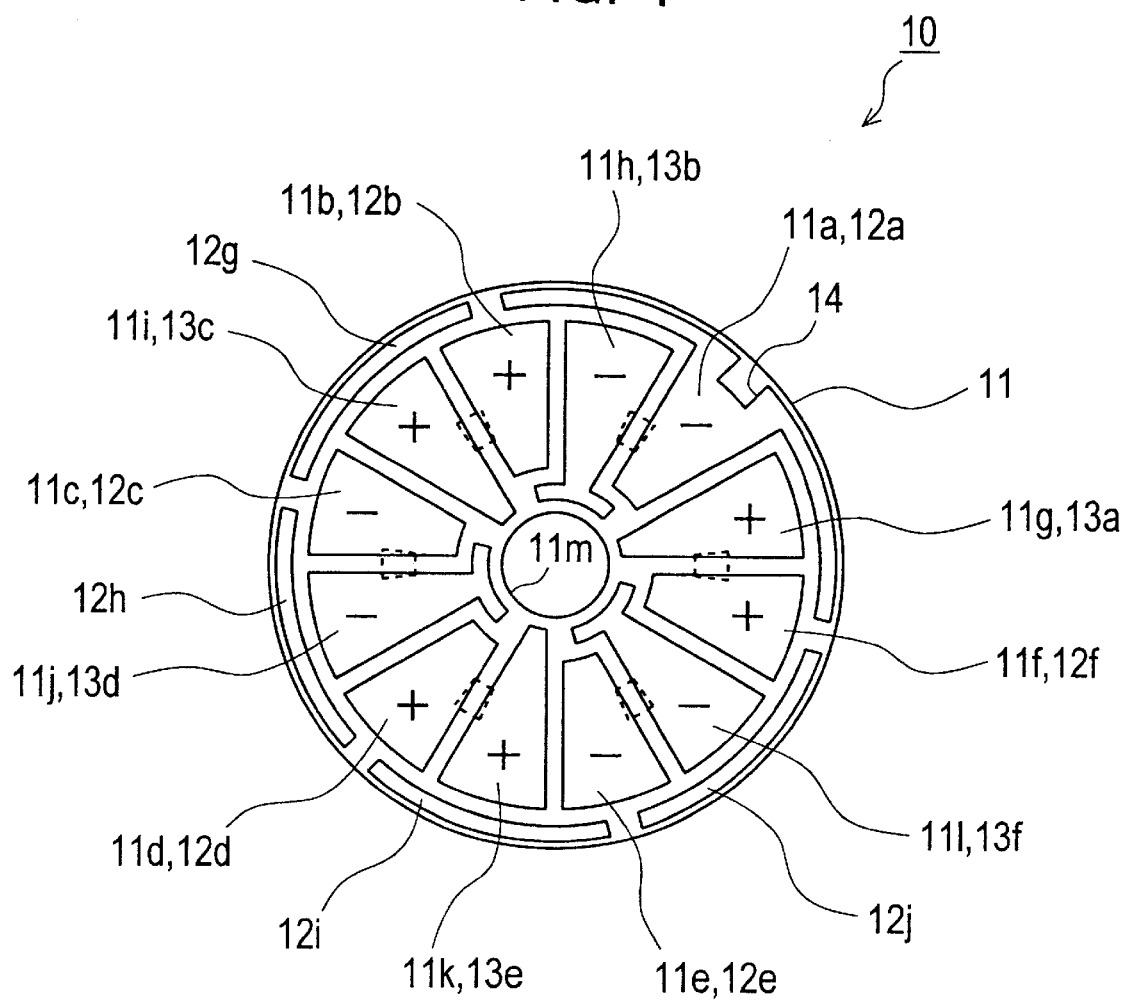
FIG. 4 is an explanatory view showing a plane structure of the piezoelectric actuator in a polarizing step according to FIG. 1.

Further, the piezoelectric element 11 is divided equally in 12 in a fan-like shape in the peripheral direction, every other ones of divided portions 11a, 11b, 11c, 11d, 11e and 11f constitute one group and divided portions 11g, 11h, 11i, 11j, 11k and 11l constitute other group. Further, respective groups of the divided portions 11a . . . 11f, 11g . . . 11l are polarized in directions alternately reversed in the thickness direction as shown by FIG. 4. That is, the divided portions 11g . . . 11l are alternately arranged with two consecutive divided portions polarized in one direction and two consecutive divided portions polarized in a direction reverse to the one direction.

The electrode pattern 12 is formed with electrodes 12a, 12b, 12c, 12d, 12d and 12f substantially in a fan-like shape at six locations in correspondence with the divided portions 11a . . . 11f and outer peripheral portions of the respective electrodes 12a . . . 12f are shortcircuited.

Further, the outer peripheral portion of the electrode 12a is formed with a marking 14 in a shape comprising three sides. The marking 14 is used as a reference in calculating a rotational angle to be compensated for in determining a direction of forming the electrode pattern of the current piezoelectric element 11.

The electrode pattern 13 is formed with electrodes 13a, 13b, 13c, 13d, 13e and 13f substantially in a fan-like shape in correspondence with the divided portions 11g . . . 11l and inner peripheral portions of the respective electrodes 13a . . . 13f are shortcircuited.

Next, an explanation will be given of a method of fabricating the piezoelectric actuator 10.

First, an explanation will be given of a positioning device used in the fabrication method.

Figure 2:
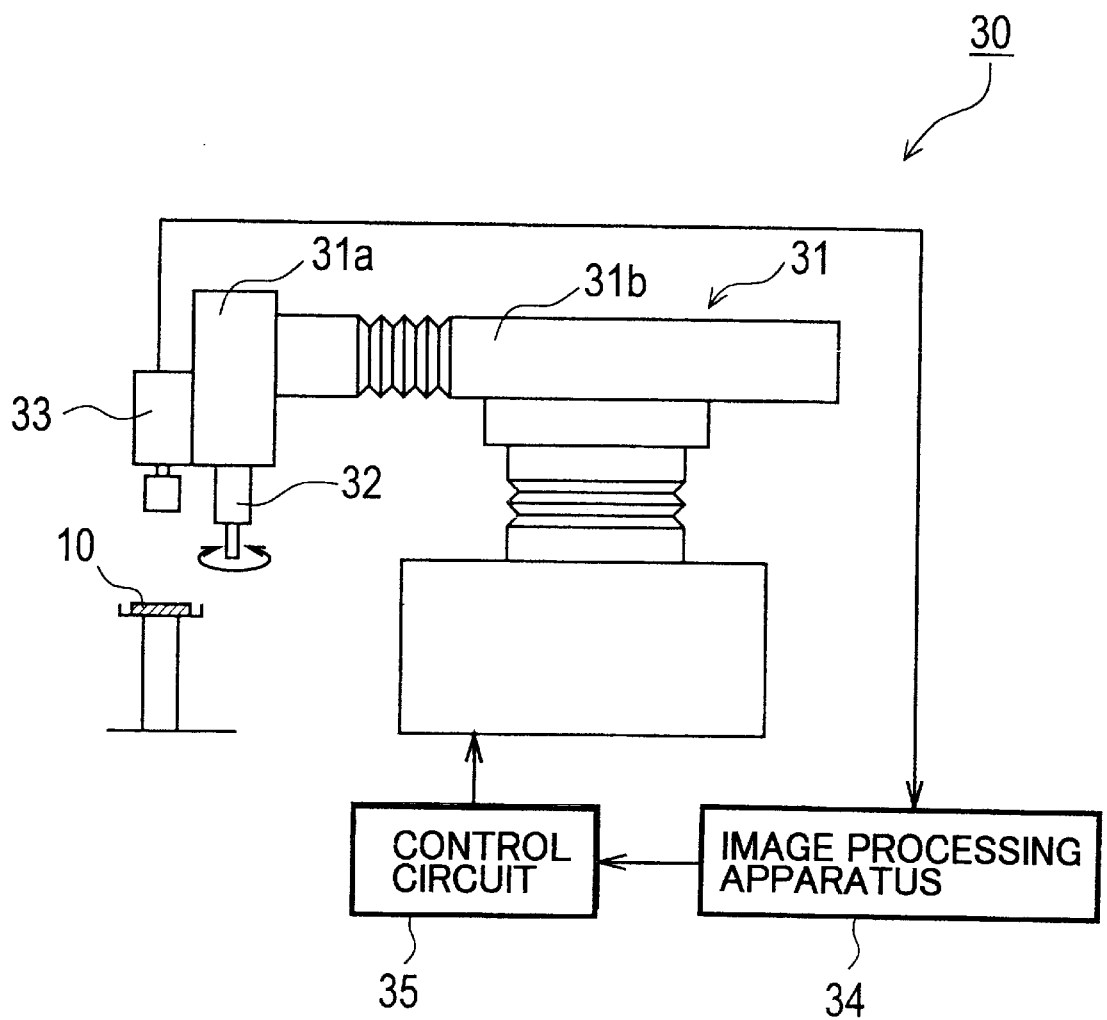
FIG. 2 is an explanatory view schematically showing a positioning device.

FIG. 2 is a view schematically showing a positioning device.

A positioning device 30 is provided with an X, Y, Z axes robot 31, a vacuum chuck 32 fixed at a front end of the X, Y, Z axes robot 31 and a CCD (Charge Coupled Device) camera 33 installed forward from the vacuum chuck 32. Further, the CCD camera 33 is connected to an image processing apparatus 34 and the image processing apparatus 34 and the X, Y, Z axes robot 31 are connected to a control circuit 35.

In this case, the X, Y, Z axes robot 31 comprises an arm 31a and an XYZ moving apparatus 31b for moving the arm 31a in X axis direction, Y axis direction and Z axis direction.

The vacuum chuck 32 sucks to chuck the piezoelectric element 11 and rotates the piezoelectric element in X-Y plane.

The image processing apparatus 34 comprises CPU (Center Processing unit), ROM (Read Only Memory), RAM (Random Access Memory), a display device, a storage device, an input/output interface and so on.

The control circuit 35 comprises CPU, ROM, RAM, an input/output interface and so on.

Further, the plane structures of the piezoelectric element 11 and electrode patterns 12 and 13 are photographed by the CCD camera 33 and the image data is outputted to the image processing apparatus 34. The display device of the image processing apparatus 34 displays the piezoelectric element 11 and the electrode patterns 12 and 13 on the coordinate axes.

CPU of the image processing apparatus 34 calculates coordinates of the center of the center hole 11m of the piezoelectric element 11 and the marking 14 of the piezoelectric element 11 on the coordinate axes. Further, by comparing the coordinates of the center of the center hole 11m and a set position of the piezoelectric element 11, a movement direction and a movement distance necessary for compensation are calculated.

Further, a rotational angle necessary for compensation is calculated by comparing a direction connecting the center of the center hole 11m and the coordinates of the marking 14 with the set direction of the piezoelectric element 11. The above-described movement direction, the movement distance and the rotational angle necessary for compensation are outputted to the control circuit 35.

The piezoelectric element 11 is sucked to chuck by the vacuum chuck 32, moved in a direction of movement necessary for compensation by an amount of a distance of movement necessary for compensation by the X, Y, Z axes robot 31 and is rotated by an amount of the rotational angle necessary for compensation by the vacuum chuck 32.

In this way, the piezoelectric element 11 is compensated to the set position and the set direction.

Figure 3:
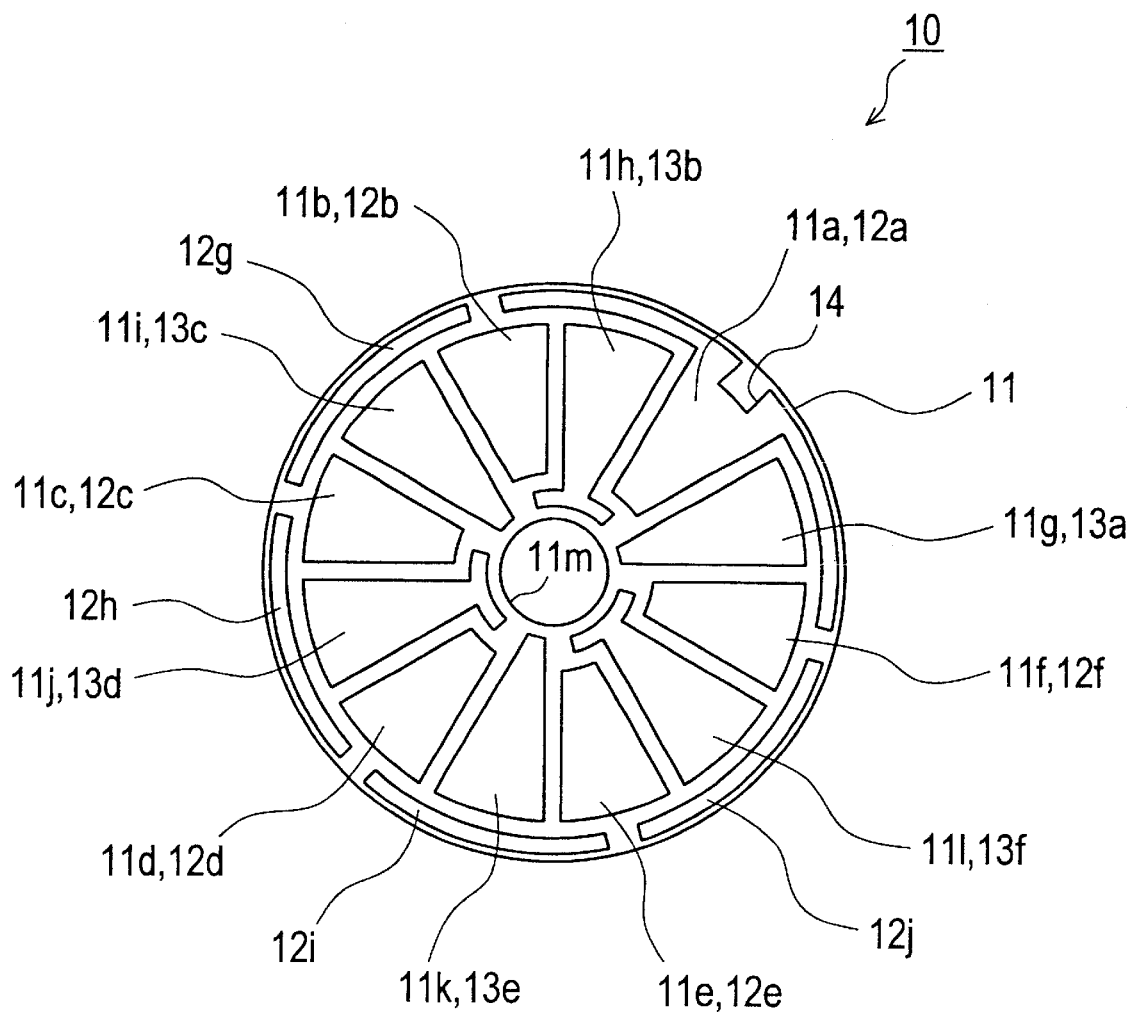
FIG. 3 is an explanatory view showing a plane structure of the piezoelectric actuator in an electrode forming step according to FIG. 1.

FIG. 3 shows a plane structure of a piezoelectric actuator in steps of forming electrodes.

Further, the electrodes 12a . . . 12f substantially in the fan-like shape are deposited by vapor deposition on the one group of the divided portions 11a . . . 11f and the electrodes 13a . . . 13f substantially in the fan-like shape are deposited by vapor deposition on the other group of the divided portions 11g . . . 11l. Further, the marking 14 in the shape comprising three sides is formed at the outer peripheral portion of the electrode 12a and extended portions in an arc-like shape are formed on both sides of the outer peripheral portion.

By forming the marking 14 in the shape comprising three sides, even when the marking 14 rests on the outer periphery of the piezoelectric element 11, the area of the marking 14 is reduced by a constant rate and accordingly, the identifying function is not reduced extremely.

Arc-like electrodes 12g, 12h, 12i and 12j are deposited by vapor deposition on outer sides of the electrodes 12b . . . 12f in an arc-like shape in the peripheral direction.

The electrodes 13b, 13d and 13f are deposited by vapor deposition with extended portions extended in an arc-like shape from both sides of inner peripheral portions and the electrodes 13a, 13c and 13e are deposited by vapor deposition with projected portions projected in directions of the center of the circle.

FIG. 4 shows a plane structure of the piezoelectric actuator in a polarizing step.

By the CCD camera 33 of the positioning device 30, the marking 14 and the center of the center hole 11m are recognized and the piezoelectric element 11 is set to the set position and the set direction.

In this case, an area surrounded by the shape comprising three sides of the marking 14 is wider than an area surrounded by a semicircle, the identifying function is promoted and accordingly, the marking 34 can be recognized by the image processing apparatus 34 further clearly.

Further, an electric field equal to or more than a negative coercive field is applied on the electrodes 12a, 12c, 12e, 13b, 13d and 13f and an electric field equal to or more than a positive coercive field is applied on the electrodes 12b, 12d, 12f, 13a, 13c and 13e.

As a result, both of the one group of the divided portions 11a . . . 11f and the other group of the divided portions 11g . . . 11l are polarized in the thickness direction alternately in reverse directions. Further, (+) in the drawing designates a direction of polarization where the surface side is made positive and the rear face side is made negative and (−) designates a direction of polarization where the surface side is made negative and the rear face side is made positive. Further, dotted lines in the drawing show an arrangement of projections installed for bringing the piezoelectric element into the press contact with an elastic moving body.

Figure 5:
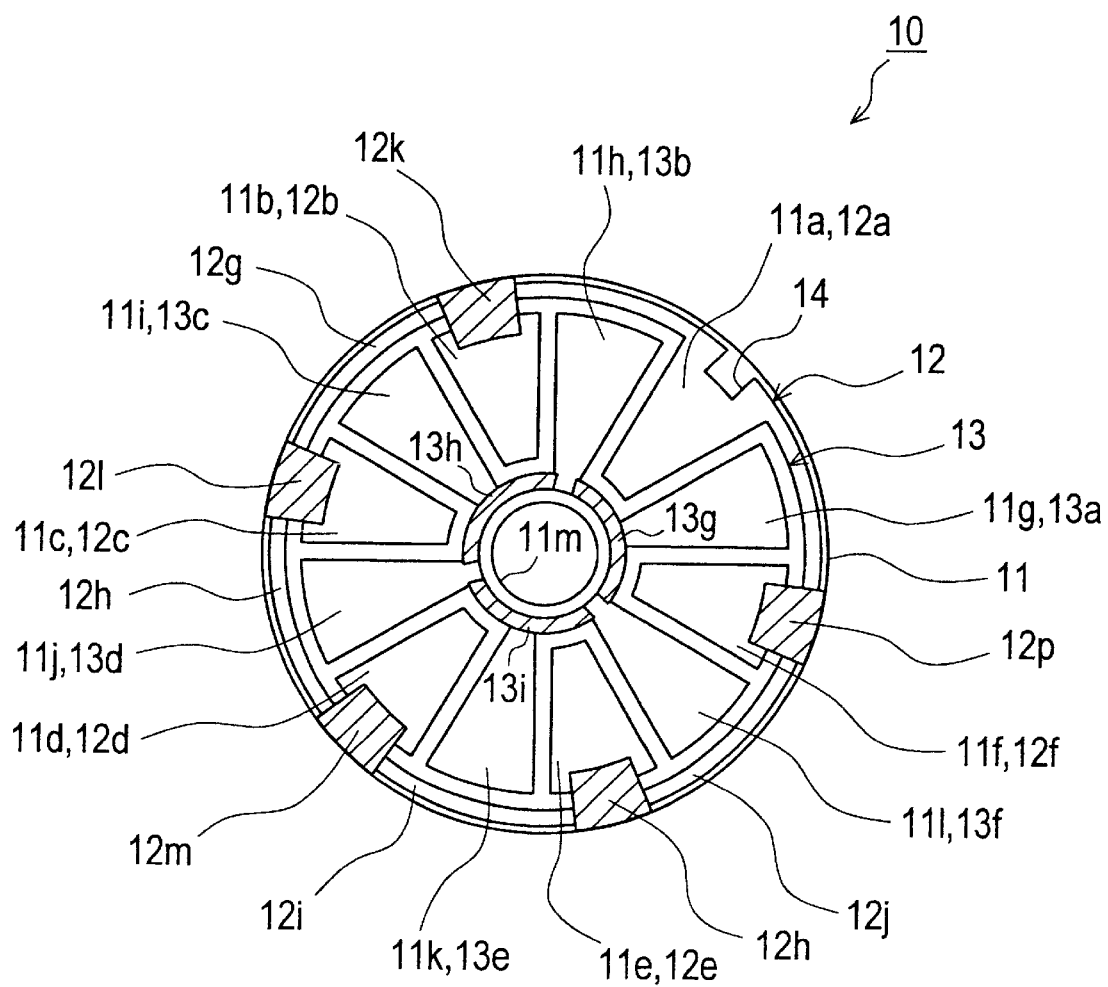
FIG. 5 is an explanatory view showing a plane structure of the piezoelectric actuator in a step of forming shortcircuit electrodes according to FIG. 1.

FIG. 5 shows a plane structure of the piezoelectric actuator in a step of forming electrodes for shortcircuiting.

By the positioning device 30, the center of the center hole 11m of the piezoelectric element 11 and the marking 14 are recognized and the piezoelectric element 11 is compensated for the set position and the set direction.

Next, a shortcircuit electrode 12k is deposited by vapor deposition among one extended portion of the electrode 12a, the arc-like electrode 12g and the outer peripheral portion of the electrode 12b, a shortcircuit electrode 12 is deposited by vapor deposition among the arc-like electrode 12g, the arc-like electrode 12h and the electrode 12c, a shortcircuit electrode 12m is deposited by vapor deposition among the arc-like electrode 12h, the electrode 12d and the arc-like electrode 12i, a shortcircuit electrode 12n is deposited by vapor deposition among the arc-like electrode 12i, the electrode 12e and the arc-like electrode 12j and a shortcircuit electrode 12p is deposited by vapor deposition among the arc-like electrode 12j, the electrode 12f and an extended portion of the electrode 12a. Further, by shortcircuiting the electrodes 12a . . . 12f, the electrode pattern 12 is formed.

A shortcircuit electrode 13g is deposited by vapor deposition among the projected portion of the electrode 13a, an extended portion of the electrode 13b and an extended portion of the electrode 13f, a shortcircuit electrode 13h is deposited by vapor deposition among the projected portion of the electrode 13c, an extended portion of the electrode 13b and an extended portion of the electrode 13d and a shortcircuit electrode 13i is deposited by vapor deposition among the projected portion of the electrode 13e, an extended portion of the electrode 13d and an extended portion of the electrode 13f. Further, by shortcircuiting the electrodes 13a . . . 13f, the electrode pattern 13 is formed.

As described above, according to the embodiment, the area surrounded by the shape comprising three sides of the marking 14 becomes larger than the area surrounded by the conventional semicircle and accordingly, the identifying function is promoted.

Further, the shape of the marking 14 is constituted by the shape comprising three sides and accordingly, even when the marking 14 rests on the outer periphery of the piezoelectric element 11, the area is reduced by a constant rate and a rapid deterioration in the identifying function is prevented.

Further, the marking 14 is recognized, the angle to be compensated for in respect of the set direction of the piezoelectric element 11 is determined with the recognized marking 14 as a reference, the piezoelectric element 11 is pivoted in accordance with the determined angle to be compensated for and accordingly, the piezoelectric element 11 is compensated in the set direction.

Embodiment 2

Figure 6:
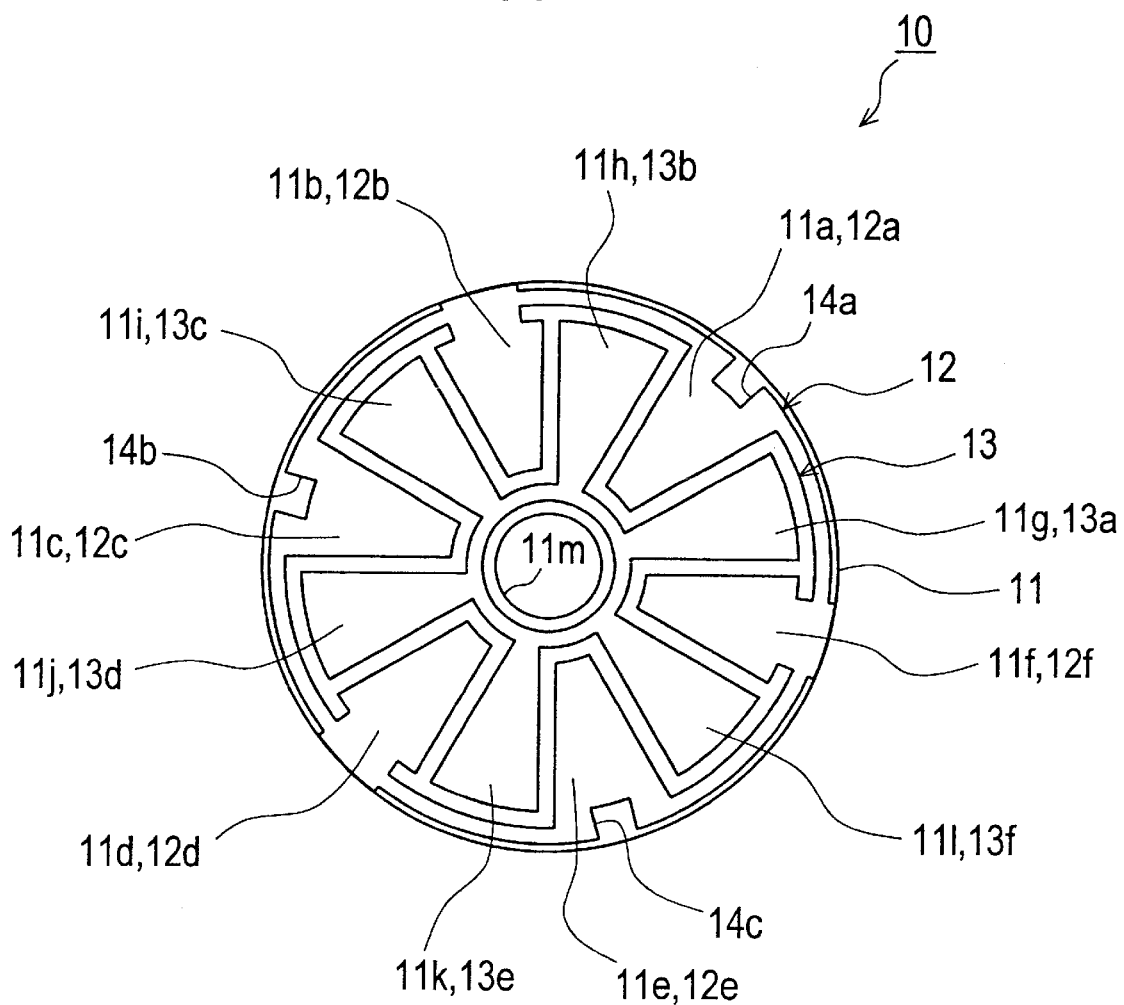
FIG. 6 is an explanatory view showing a plane structure of a piezoelectric actuator according to Embodiment 2 to which the invention is applied.

FIG. 6 shows a plane structure of a piezoelectric actuator according to the embodiment 2 to which the invention is applied.

The piezoelectric actuator 10 is featured in that markings 14a, 14b and 14c having a shape the same as that of the marking 14 used in Embodiment 1 are formed at outer peripheral portions of the electrodes 12a, 12c and 12e. Further, constitutions similar to those in Embodiment 1 are attached with the same notations and an explanation thereof will be omitted.

That is, the markings 14a, 14b and 14c are arranged at respective units of a regularly polarized arrangement among 12 of the divided portions 11a . . . 11a of the piezoelectric element 11 (twice as much as a number of the consecutive divided portions in the same direction of polarization) and are arranged at equal intervals. Further, by recognizing any one of the markings 14a, 14b and 14c, directions of polarization of the respective divided portions 11a . . . 11l of the piezoelectric element 11 are specified. Accordingly, in positioning in connecting leads to the respective electrode patterns 12 and 13, in positioning in assembling a motor, in positioning the piezoelectric actuator 10 to the projections of the elastic body, in positioning in vapor deposition of the shortcircuit electrodes and in positioning in carrying out polarizing operation, an angle to be compensated for is equal to or smaller than 60° and the angle to be compensated for becomes smaller than 180° when one marking is installed or 90° when two markings are installed.

TABLE 1

| No. of divisions n | No. of consecutive polarization direction p | Optimum No. of markings m |
|---|---|---|
| 2 | 1 | 1 |
| 4 | 1 | 2 |
|   | 2 | 1 |
| 6 | 1 | 3 |
|   | 3 | 1 |
| 8 | 1 | 4 |
|   | 2 | 2 |
|   | 4 | 1 |
| 10 | 1 | 5 |
|   | 5 | 1 |
| 12 | 1 | 6 |
|   | 2 | 3 |
|   | 3 | 2 |
|   | 6 | 1 |

TABLE 1-continued

| | No. of divisions | |
|---|---|---|
| n | No. of consecutive polarization direction p | Optimum No. of markings m |
| 14 | 1 | 7 |
| | 7 | 1 |
| 16 | 1 | 8 |
| | 2 | 4 |
| | 4 | 2 |
| | 8 | 1 |
| 18 | 1 | 9 |
| | 3 | 3 |
| | 9 | 1 |
| 20 | 1 | 10 |
| | 5 | 2 |
| | 10 | 1 |

Table 1 shows a relationship among a number of dividing the piezoelectric element 11 in the peripheral direction, a number of consecutive divided portions in the same polarization direction and an optimum number of markings.

When the above-described number of markings is generalized, it is expressed by $m=n/(p \times 2)$ (m: an optimum number of markings, n: a number of dividing the piezoelectric element, p: a number of consecutive divided portions in the same direction of polarization).

For example, when the number of divisions is set to 12, in the case where the number of consecutive divisions in the same polarization direction is 1, markings of $12/(1 \times 2)=6$ are formed at equal intervals. When the number of consecutive divisions in the same polarization direction is 2, markings of $12/(2 \times 2)=3$ are formed at equal intervals. When the number of consecutive divisions in the same polarization direction is 3, markings of $12/(3 \times 2)=2$ are formed at equal intervals. When the number of consecutive divisions in the same polarization direction is 6, a marking of $12/(6 \times 2)=1$ may be formed. Further, when any of the markings is recognized, the situation of the polarization direction of the piezoelectric element 11 becomes uniquely clarified.

Embodiment 3

Figure 7:
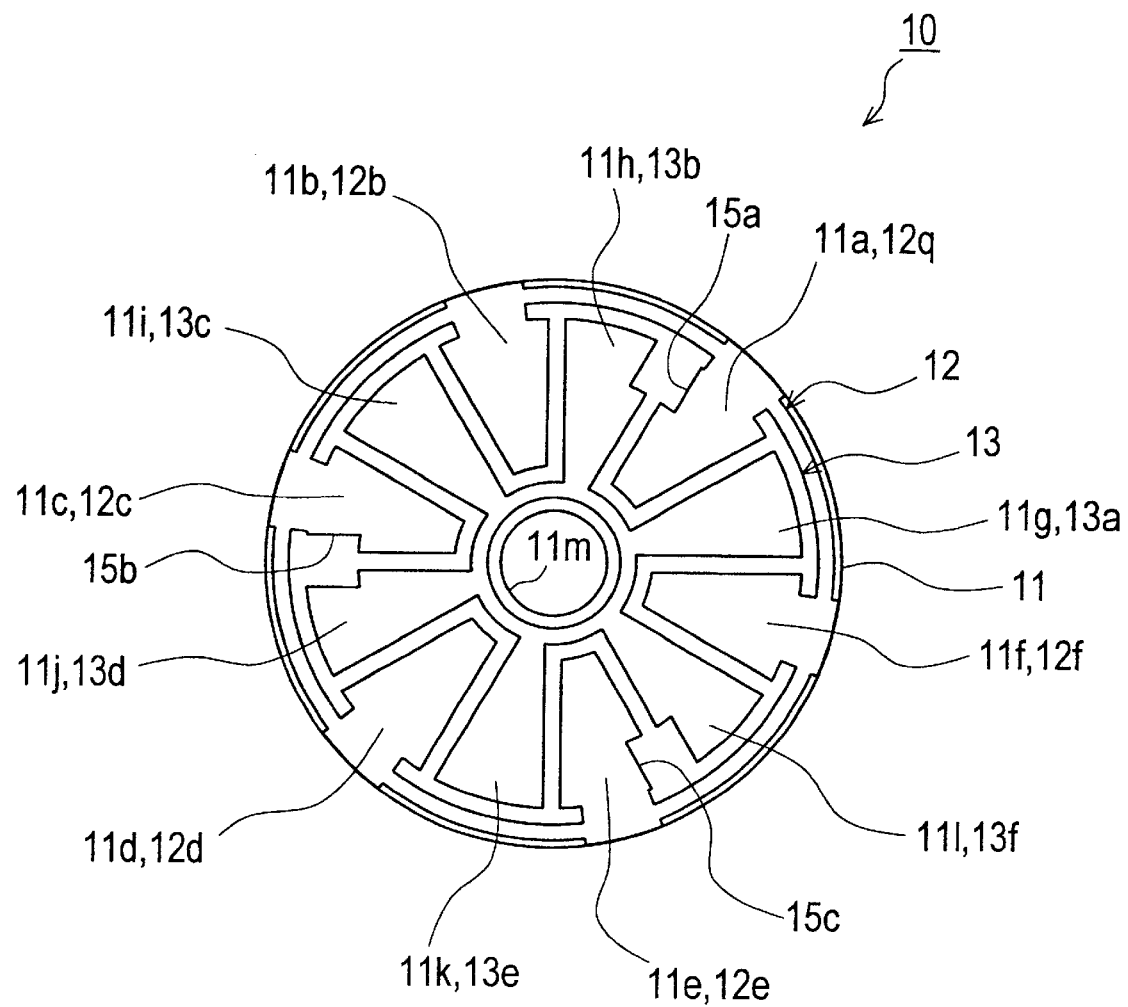
FIG. 7 is an explanatory view showing a plane structure of a piezoelectric actuator according to Embodiment 3 to which the invention is applied.

FIG. 7 shows a plane structure of a piezoelectric actuator according to Embodiment 3 to which the invention is applied.

According to the piezoelectric actuator 10, a marking 15a in a shape comprising three sides is formed between an electrode 12q of the electrode pattern 12 and the electrode 13b of the electrode pattern 13 which are contiguous to each other on inner sides of the outer peripheries of the electrode patterns 12 and 13 to each other. Similarly, a marking 15b is formed between the electrode 12c and the electrode 13d and a marking 15c is formed between the electrode 12e and the electrode 13f.

According to such markings 15a, 15b and 15c, even when the electrode patterns 12 and 13 are formed to shift from each other on the piezoelectric element 11, the markings do not rest on the outer periphery of the piezoelectric element 11 and the identifying function is maintained.

Next, an explanation will be given of a method of fabricating the piezoelectric actuator.

Figure 8:
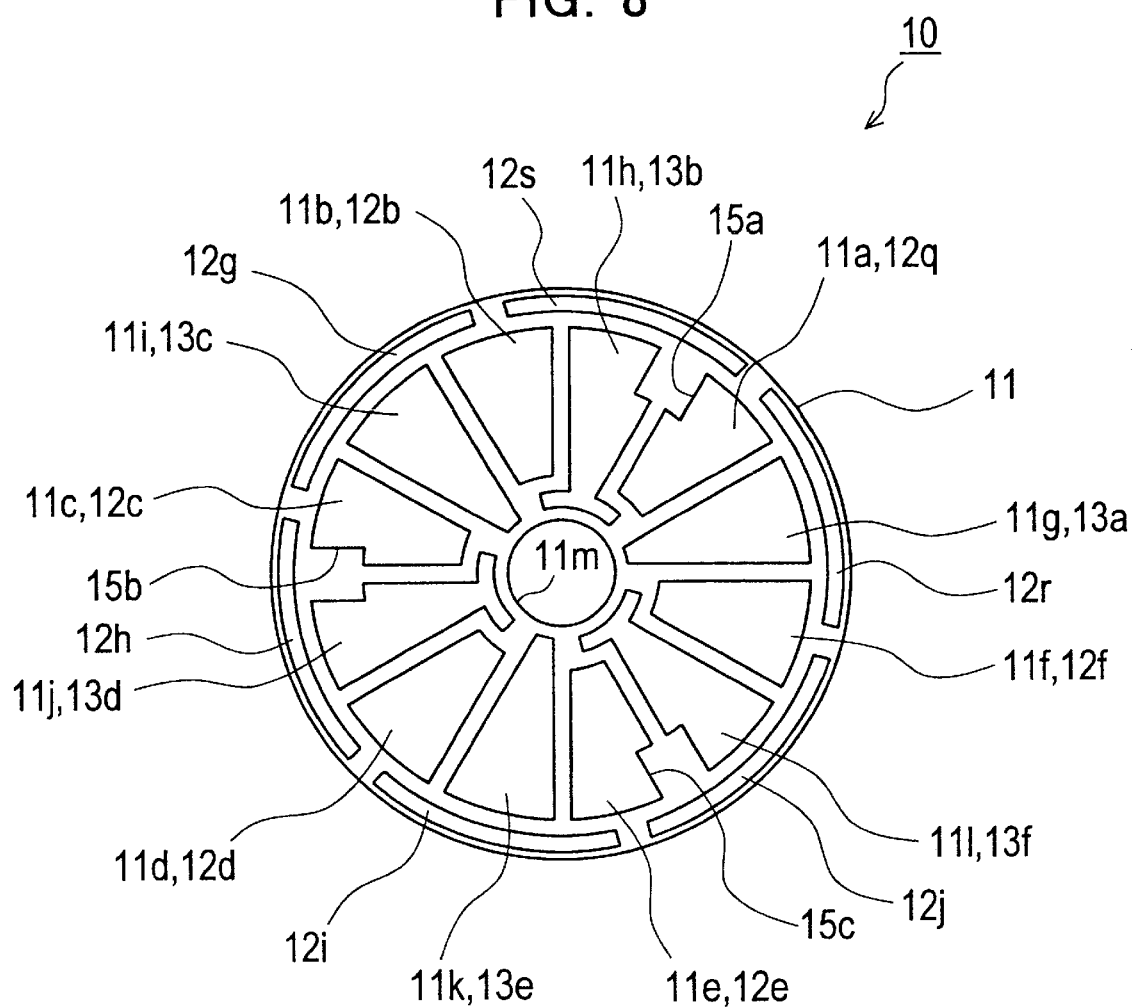
FIG. 8 is an explanatory view showing a plane structure of the piezoelectric actuator in an electrode forming step according to FIG. 7.

FIG. 8 shows a plane structure of the piezoelectric actuator in a step of forming electrodes.

First, the electrodes 12b . . . 12f, 12q substantially in the fan-like shape are deposited by vapor deposition on one group of the divided portions 11a . . . 11f of the piezoelectric element 11. Further, the marking 15a in the shape comprising three sides is formed between the electrode 12q and the electrode 13b contiguous to each other, further, similarly, the marking 15b is formed between the electrode 12c and the electrode 13d and the marking 15c is formed between the electrode 12e and the electrode 13f.

In this case, the markings 15a, 15b and 15c are arranged at the respective number of the consecutive divided portions in the same polarization direction which is multiplied by 2, that is, at the respective minimum unit of expressing an arrangement in polarization directions and arranged at equal intervals.

Further, arc-like electrodes 12g, 12h, 12i, 12j, 12r and 12s are deposited by vapor deposition at the outer peripheral portion of the piezoelectric element 11.

Figure 9:
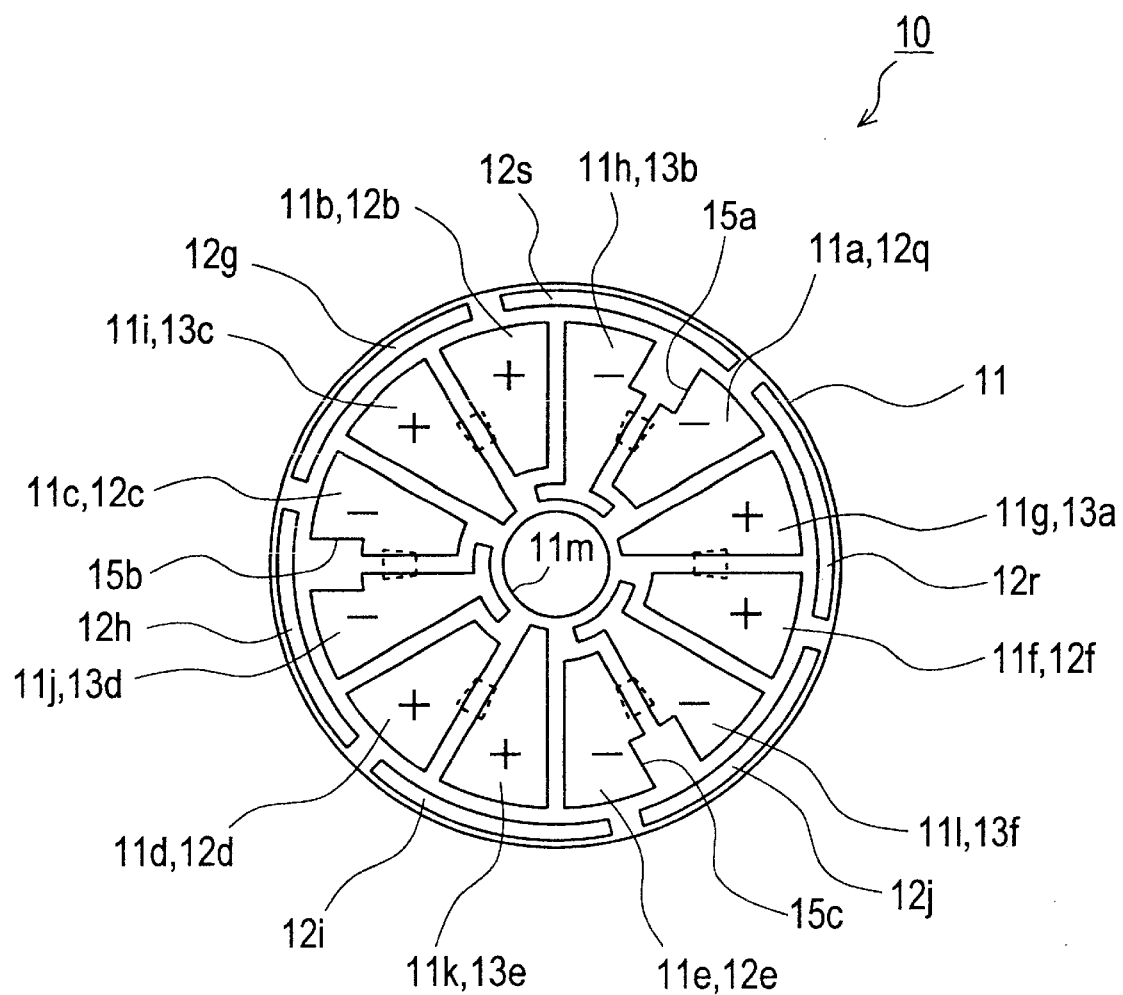
FIG. 9 is an explanatory view showing a plane structure of the piezoelectric actuator in a polarizing step according to FIG. 7.
Figure 10:
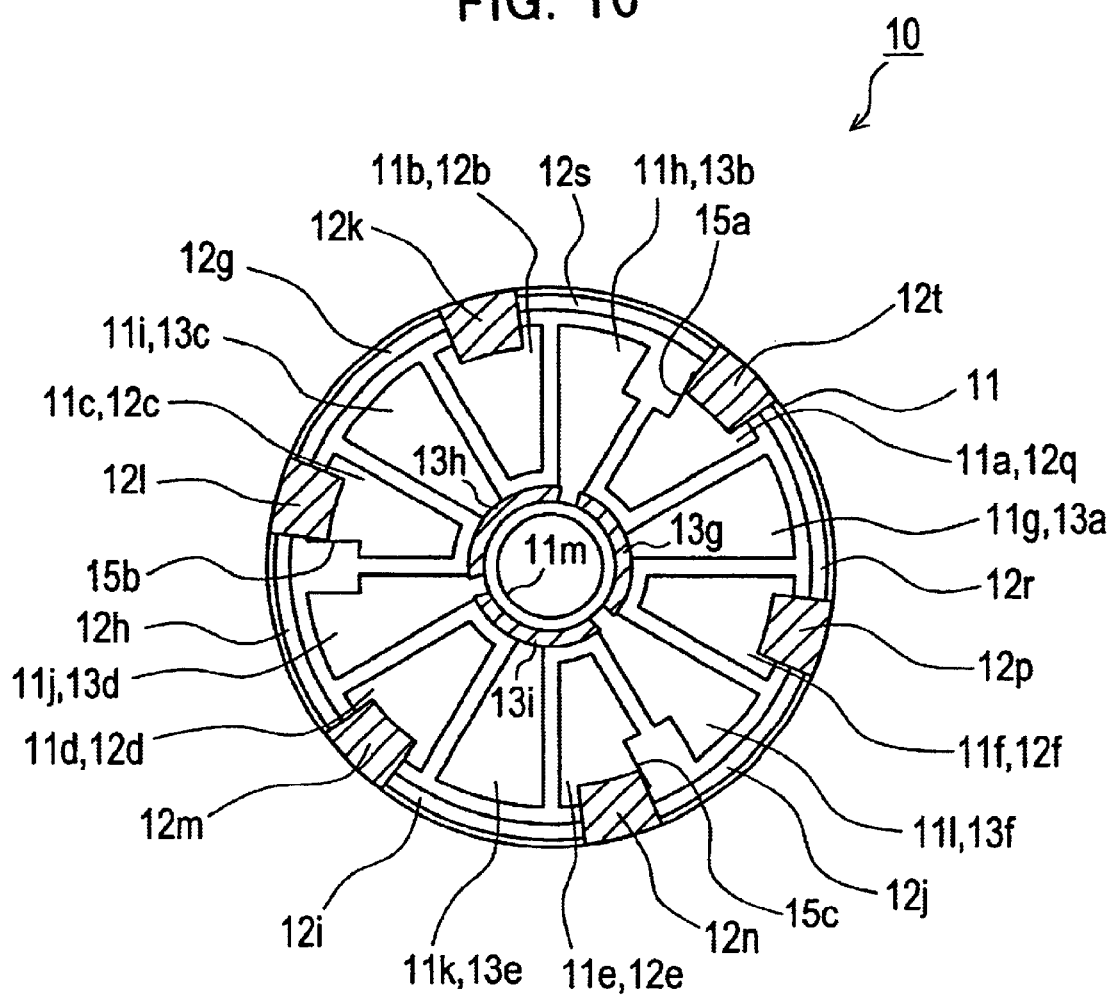
FIG. 10 is an explanatory view showing a plane structure of the piezoelectric actuator in a step of forming shortcircuit electrodes according to FIG. 7.

FIG. 9 shows a plane structure of the piezoelectric actuator in a polarizing step and FIG. 10 shows a plane structure of the piezoelectric actuator in a step of forming shortcircuit electrodes.

In the polarizing step, by the positioning device 30, for example, the marking 15a and the center of the center hole 11m are recognized, the set direction and the set position of the piezoelectric element 11 are compensated for and polarizing operation similar to that in Embodiment 1 is carried out.

Next, in the step of forming the shortcircuit electrodes, by the positioning device 30, for example, the marking 15b and the center of the center hole 11m are recognized and the set direction and the set position of the piezoelectric element 11 are compensated for.

In this case, only by recognizing a single one of the marking 15b, the polarization directions of the respective divided portions 11a . . . 11g of the piezoelectric element 11 become apparent, the angle to be dispensed for is within a range of 60° and the piezoelectric element 11 is compensated to the set direction efficiently.

As shown by FIG. 10, a shortcircuit electrode 12t is formed among the arc-like electrode 12r, the arc-like electrode 12s and the electrode 12q and in respect of other positions, similar to Embodiment 1, the shortcircuit electrodes 12k, 12, 12m, 12n, 12p, 13g, 13h and 13i are deposited by vapor deposition.

As has been described, according to the embodiment, other than achieving an effect similar to that in Embodiment 1, when the electrode patterns 12 and 13 are formed to shift from the piezoelectric element 11, the markings 15a, 15b and 15c do not rest on the outer periphery of the piezoelectric element 11, areas of the markings 15a, 15b and 15c are not reduced and accordingly, the identifying function is maintained.

Further, arrangement of the markings 15a, 15b and 15c is optimized and accordingly, by recognizing any one of the markings 15a 15c, directions of polarization of the divided portions 11a . . . 11l of the piezoelectric element 11 are clarified and the piezoelectric element 11 is efficiently compensated to the set direction.

Further, the embodiment may be modified as follows.

Figure 11:
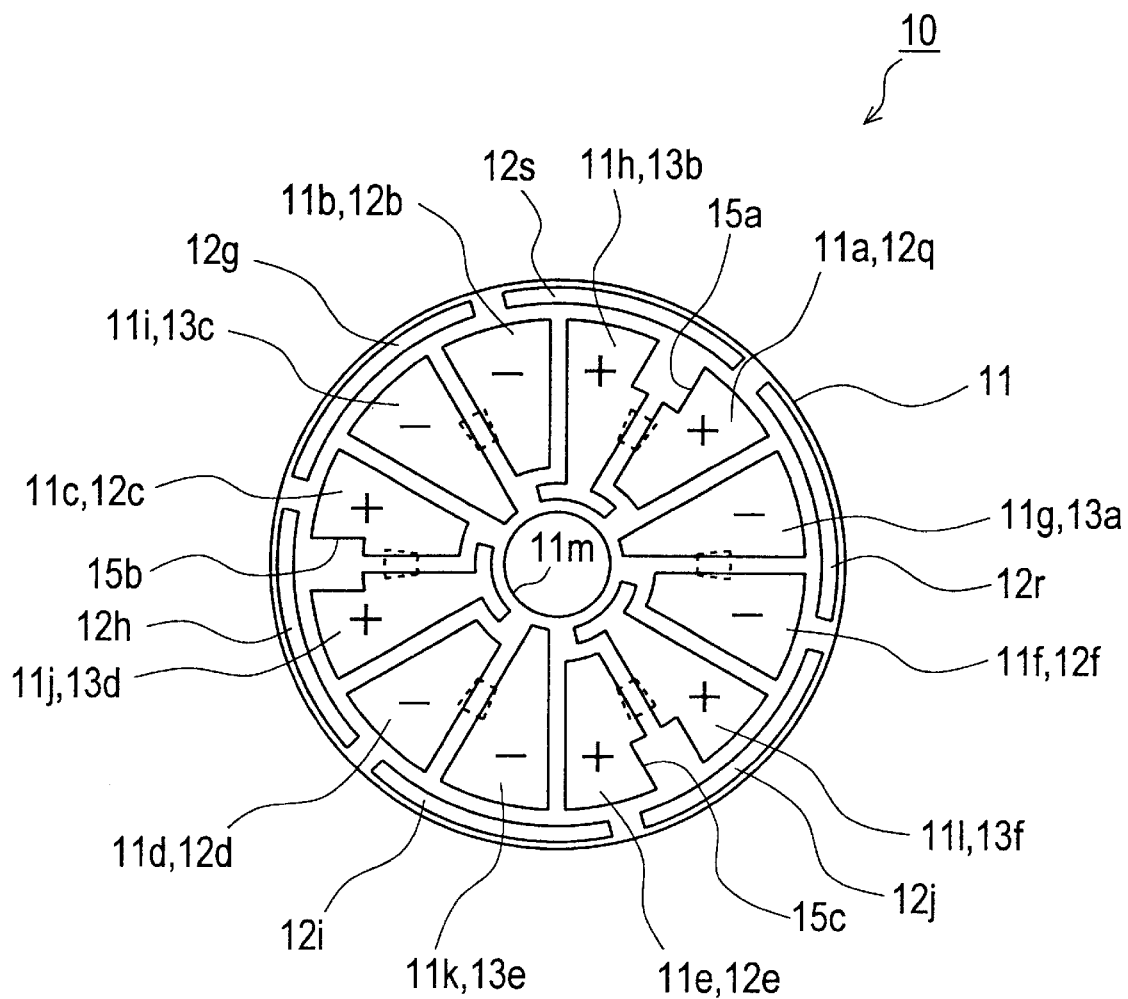
FIG. 11 is an explanatory view showing a plane structure in a polarizing step of a piezoelectric actuator in a first modified mode according to FIG. 7.

FIG. 11 shows a plane structure in the polarizing step in respect of a piezoelectric actuator according to a first modified mode of Embodiment 3.

According thereto, directions of polarization of the respective divided portions 11a . . . 11f, 11g . . . 11l are brought into a relationship reverse to that of the piezoelectric actuator according to Embodiment 3.

Figure 12:
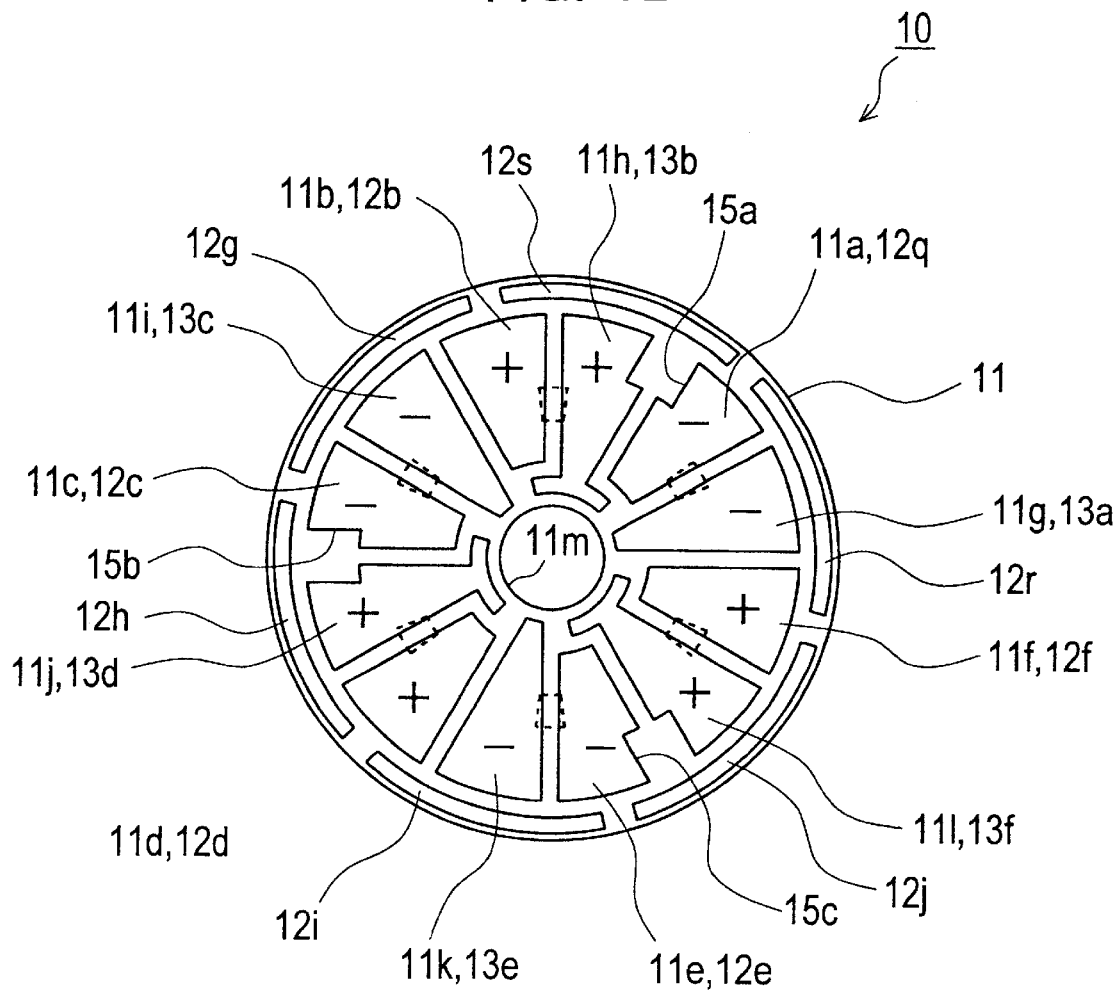
FIG. 12 is an explanatory view showing a plane structure in a polarizing step of a piezoelectric actuator in a second modified mode according to FIG. 7.

FIG. 12 is a plane structure in the polarizing step of a piezoelectric actuator according to a second modified mode of Embodiment 3.

According thereto, directions of polarization of the respective divided portions 11a . . . 11f, 11g . . . 11l are brought into a relationship where they are shifted by one divided portion to the counterclockwise direction from those of the piezoelectric actuator according to Embodiment 3. Further, in this modified mode, polarities of (+) and (−) may be switched.

Figure 13:
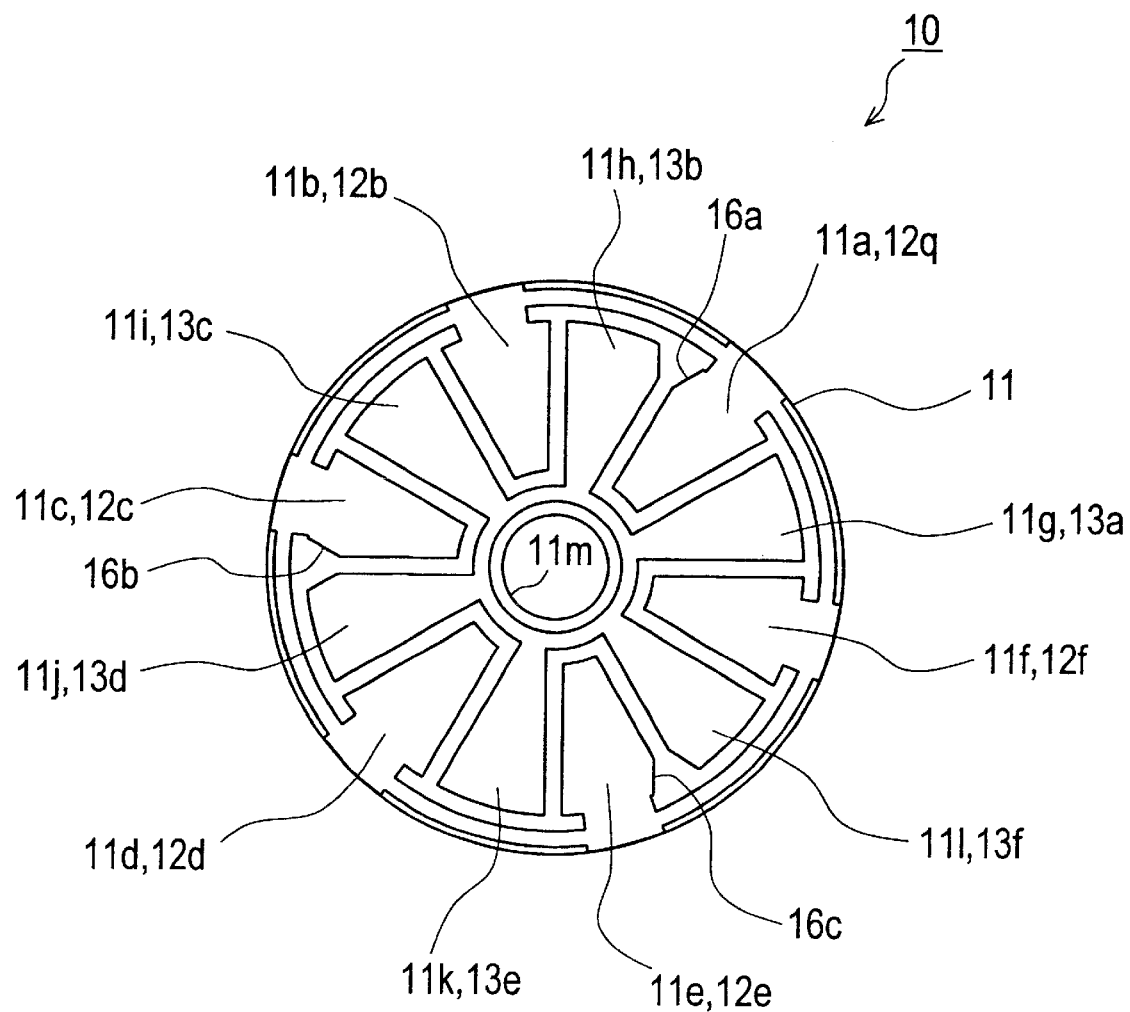
FIG. 13 is an explanatory view showing a plane structure of a piezoelectric actuator in a third modified mode according to FIG. 7.

FIG. 13 shows a plane structure of a piezoelectric actuator according to a third modified mode of Embodiment 3.

The piezoelectric actuator 10 is featured in that in place of the markings 15a, 15b and 15c, markings 16a, 16b and 16c in a shape comprising two sides are formed.

Figure 14:
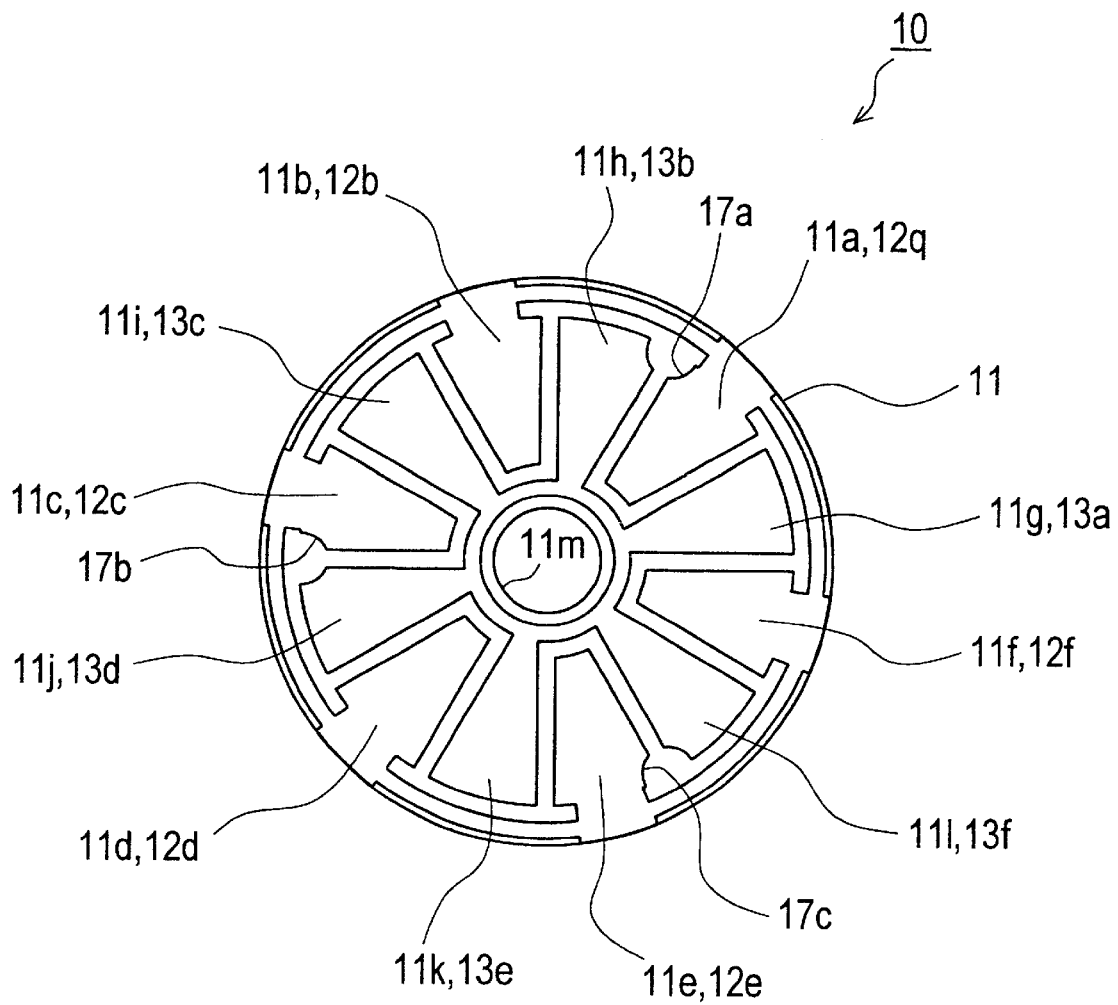
FIG. 14 is an explanatory view showing a plane structure of a piezoelectric actuator in a fourth modified mode according to FIG. 7.

FIG. 14 shows a plane structure of a piezoelectric actuator according to a fourth modified mode of Embodiment 3.

The piezoelectric actuator 10 is featured in that in place of the markings 15a, 15b and 15c in the shape comprising three sides, markings 17a, 17b and 17c in a semicircular shape are formed.

Figure 15:
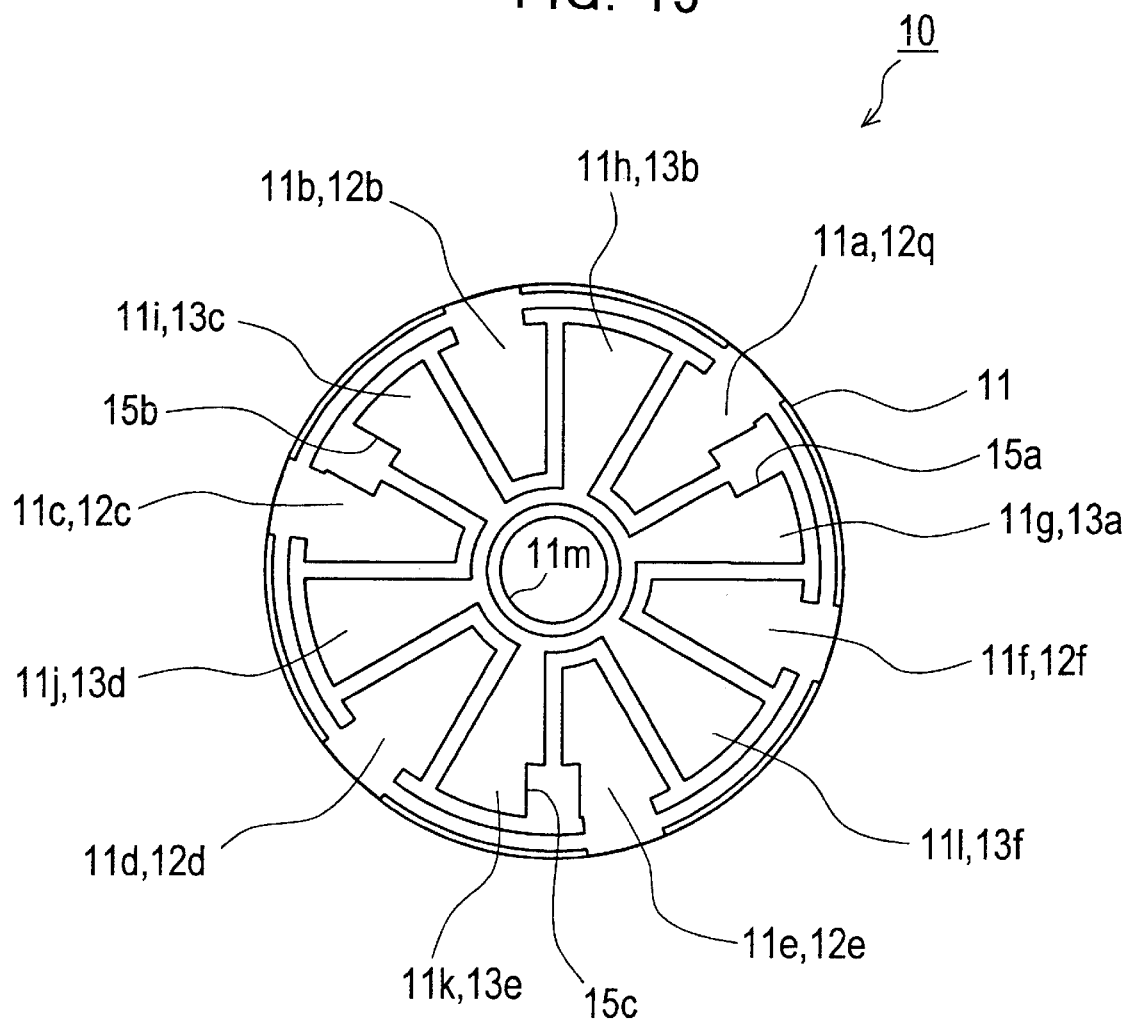

FIG. 15 shows a plane structure of a piezoelectric actuator according to a fifth modified mode of Embodiment 3.

The piezoelectric actuator 10 is featured in that the marking 15a in the shape comprising three sides is formed between the electrode 12q and the electrode 13a, the marking 15b in the shape comprising three sides is formed between the electrode 12c and the electrode 13c and the marking 15c in the shape comprising three sides is formed between the electrode 12e and the electrode 13e.

Figure 16:
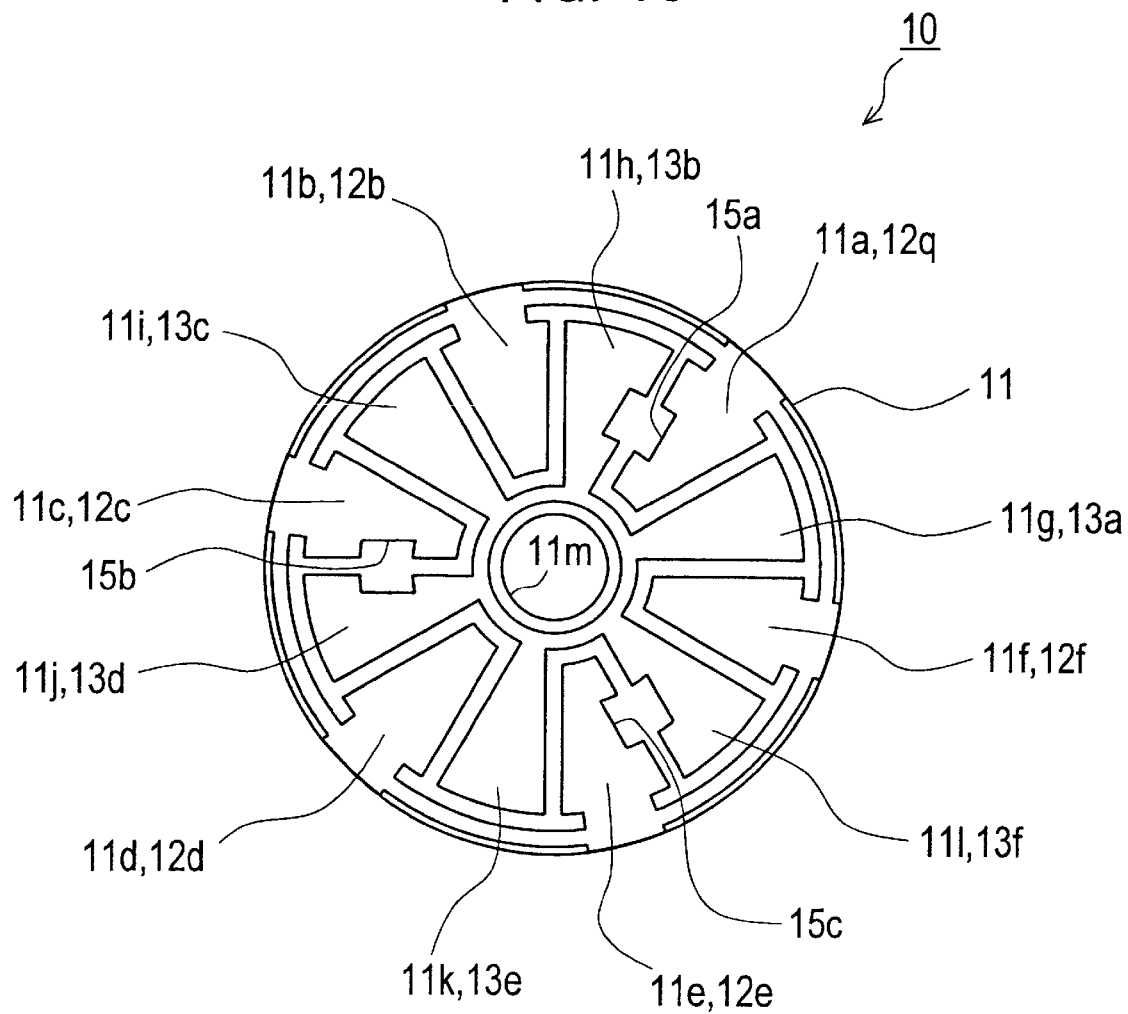
FIG. 16 is an explanatory view showing a plane structure of a piezoelectric actuator in a sixth modified mode according to FIG. 7.
Figure 17:
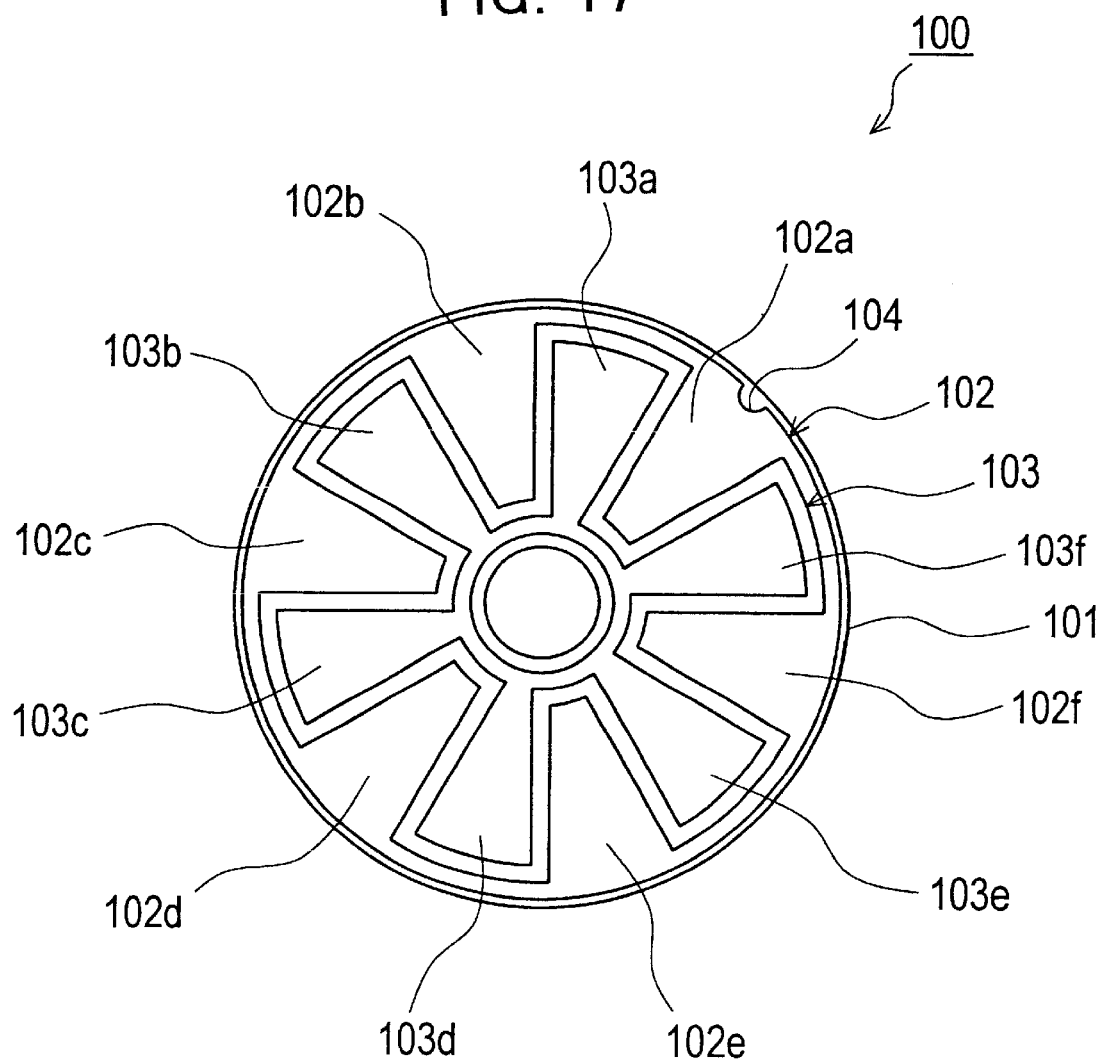
FIG. 17 is an explanatory view showing a plane structure of a piezoelectric actuator according to a conventional technology.

FIG. 16 shows a plane structure of a piezoelectric actuator according to a six modified mode of Embodiment 3.

The piezoelectric actuator 10 is featured in that the markings 15a, 15b and 15c respectively in a quadrilateral shape are formed at intermediary positions in the diameter direction of the electrode patterns 12 and 13.

According thereto, even when the electrode patterns 12 and 13 are formed to shift toward an outer diameter direction of the piezoelectric element 11, there is achieved an advantage that the markings 15a, 15b and 15c suffer less adverse influence.

As has been described, an area surrounded by a shape comprising multiple sides becomes larger than the area surrounded by a semicircle and accordingly, the function of identifying markings is promoted. Further, when the marking having the shape comprising multiple sides rests on the outer periphery of a piezoelectric element, the area is reduced in accordance with an internal angle of the shape comprising multiple sides and accordingly, the rate of reducing the area is smaller than that of reducing the marking in the semicircular shape.

Further, an area surrounded by a shape comprising three sides becomes larger than the area surrounded by a semicircle and accordingly, the function of identifying the marking is promoted. Further, when the marking in the shape comprising three sides rests on the outer periphery of a piezoelectric element, the area is reduced by a constant rate and accordingly, the rate of reducing the area is smaller than that of reducing that of the marking in the semicircular shape.

Further, the marking is disposed on an inner side of an outer periphery of an electrode pattern and even when the electrode pattern rests on the outer periphery of a piezoelectric element, no adverse influence is effected and accordingly, sufficient identifying function is ensured.

Further, by recognizing the markings, directions of polarization of respective divided portions of a piezoelectric element can be specified and accordingly, when a direction of forming an electrode pattern of a piezoelectric element is compensated for, an angle to be compensated for can be reduced.

Further, the marking formed at an electrode pattern on a piezoelectric element is clearly recognized, the direction of forming an electrode pattern of a piezoelectric element is determined based on the recognized marking, an angle to be compensated for is determined by comparing the direction of forming the electrode pattern of the piezoelectric element with a set direction thereof, the piezoelectric element is pivoted by an amount of the angle to be compensated for and accordingly, the piezoelectric element is compensated to the set direction.

What is claimed is:

1. A piezoelectric actuator comprising: a piezoelectric element; an electrode pattern formed on the piezoelectric element; and at least one identifying marking formed on the electrode pattern, each of the at least one identifying markings having a shape comprising multiple straight sides so misalignment during formation of the electrode pattern on the piezoelectric element whereby a portion of an identifying marking is not formed on the electrode pattern results in a linear variation in area of the identifying marking and not a variation in area of the identifying marking based on a squared value of a dimension thereof; and wherein the at least one identifying marking is formed at a specific location of the electrode pattern for use in identifying a characteristic of the electrode pattern.

2. A piezoelectric actuator according to claim 1; wherein the at lease one identifying marking has a shape comprising three straight sides.

3. A piezoelectric actuator comprising: a piezoelectric element divided in a peripheral direction and having a plurality of divided. portions; electrodes formed at divided portions of the piezoelectric element, at least two of the electrodes being formed so as to be contiguous to each other to form an electrode pattern; and at least one identifying marking for use in identifying a characteristic of the electrode pattern of the piezoelectric element, the identifying marking being formed proximate an outer periphery of the electrode pattern and between the contiguous electrodes in the electrode pattern.

4. A piezoelectric actuator comprising: a piezoelectric element divided equally into an integer number n divided portions in a peripheral direction and having an integer number p of divided portions polarized in a first direction alternately arranaed with respect to an integer number p of divided portions polarized in a second direction opposite the first direction; electrodes formed at an integer number n of the divided portions of the piezoelectric element to form an electrode pattern; and an integer number m identifying markings formed in the electrode pattern for use in identifying a characteristic of the electrode pattern of the piezoelectric element, the m identifying markings being formed at equal intervals in accordance with the relation $m=n/(2\times p)$.

5. A method of compensating a direction of the piezoelectric actuator according to any one of claims 1 to 4; comprising the steps of recognizing the identifying markings formed at the electrode pattern on the piezoelectric element;

determining the direction of formation of the electrode pattern of the piezoelectric element based on the recognized identifying markings;

determining an angle by which the piezoelectric element is to be compensated by comparing the orientation of the electrode pattern and a preset orientation of the electrode pattern of the piezoelectric element; and compensating the piezoelectric element by pivoting the piezoelectric element by the determined angle.

6. A piezoelectric actuator according to claim 1; wherein the piezoelectric element has a disk shape, the electrode pattern comprises a plurality of electrodes provided on an inner side of the piezoelectric element, selected electrodes being connected to each other in a desired pattern, and the identifying marking is formed on the electrode pattern proximate a peripheral edge of the piezoelectric element and has at least three straight sides so that the area of the identifying marking is based on the length of its sides rather than a radius thereof; whereby misalignment of the identifying marking with respect to the curved peripheral edge of the disk-shaped piezoelectric element results in reduction in area of the identifying marking on a linear basis rather than based on a squared value of the radius.

7. A piezoelectric actuator according to claim 1; wherein the at least one identifying marking comprises a plurality of identifying markings arranged in a spaced-apart relation on the piezoelectric element.

8. A piezoelectric:actuator according to claim 7; wherein the piezoelectric element has a curved peripheral edge and is divided equally into an integer number n divided portions along the peripheral edge, the piezoelectric element is polarized so that an integer number p of consecutive divided portions of the piezoelectric element polarized in a first direction and an integer number p of consecutive divided portions of the piezoelectric element polarized in a second direction opposite the first direction are alternately arranged and electrodes are formed at an integer number n of the divided portions of the piezoelectric element to form the electrode pattern.

9. A piezoelectric actuator according to claim 8; wherein an integer number of identifying markings are formed on the electrode pattern at equal intervals in accordance with the relation $m=n/(2\times p)$.

10. A piezoelectric actuator comprising: a piezoelectric element; an electrode pattern formed on the piezoelectric element; and at least one identifying marking formed on the electrode pattern, each of the at least one identifying markings having a shape comprising multiple sides and being formed at a specific location of the electrode pattern for use in identifying a characteristic of the electrode pattern; wherein the area of the identifying marking is based on the length of its sides rather than a radius so that misalignment of the identifying marking with respect to the piezoelectric element results in reduction in area of the identifying marking on a linear basis rather than based on a squared value of a radius.

11. A piezoelectric actuator according to claim 10; wherein the piezoelectric element has a disk shape, the electrode pattern comprises a plurality of electrodes provided on an inner side of the piezoelectric element, selected electrodes being connected to each other in a desired pattern, and the identifying marking is formed on the electrode pattern proximate a peripheral edge of the piezoelectric element and has at least three straight sides so that the area of the identifying marking is based on the length of its sides rather than a radius; whereby misalignment of the identifying marking with respect to the curved peripheral edge of the disk-shaped piezoelectric element results in reduction in area of the identifying marking on a linear basis rather than based on a squared value of a radius.

12. A piezoelectric actuator according to claim 10; wherein the at least one identifying marking comprises a plurality of identifying markings arranged in a spaced-apart relation on the piezoelectric element.

13. A piezoelectric actuator according to claim 12; wherein the piezoelectric element has a curved peripheral edge and is divided equally into an integer number n divided portions along the peripheral edge, the piezoelectric element is polarized so that an integer number p of consecutive divided portions of the piezoelectric element polarized in a first direction and an integer number p of consecutive divided portions of the piezoelectric element polarized in a second direction opposite the first direction are alternately arranged and electrodes are formed at an integer number n of the divided portions of the piezoelectric element to form the electrode pattern.

14. A piezoelectric actuator according to claim 8; wherein an integer number m of identifying markings are formed on the electrode pattern at equal intervals in accordance with the relation $m=n/(2\times p)$.

15. A piezoelectric actuator according to claim 10; wherein the at lease one identifying marking has a shape comprising three straight sides.

16. A piezoelectric actuator according to claim 10; wherein the at least one identifying marking has a polygonal shape.

17. A piezoelectric actuator according to claim 10; wherein the piezoelectric element is divided in a peripheral direction thereof into a plurality of divided portions, the electrode pattern comprises a plurality of electrodes formed at divided portions of the piezoelectric element, at least two of the electrodes being formed to be contiguous to each other to form the electrode pattern; and wherein the at least one identifying marking is formed on an inner side of an outer periphery of the electrode pattern and between the contiguous electrodes.

* * * * *